(12) United States Patent
Catthoor et al.

(10) Patent No.: US 11,381,242 B2
(45) Date of Patent: Jul. 5, 2022

(54) 3D INTEGRATED CIRCUIT

(71) Applicant: IMEC VZW, Leuven (BE)

(72) Inventors: Francky Catthoor, Temse (BE);
Edouard Giacomin, Leuven (BE);
Juergen Boemmels, Heverlee (BE);
Julien Ryckaert, Schaerbeek (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/063,003

(22) Filed: Oct. 5, 2020

(65) Prior Publication Data
US 2022/0109447 A1 Apr. 7, 2022

(51) Int. Cl.
*H03K 19/17736* (2020.01)
*H01L 27/06* (2006.01)

(52) U.S. Cl.
CPC ... *H03K 19/17744* (2013.01); *H01L 27/0688* (2013.01)

(58) Field of Classification Search
None
See application file for complete search history.

(56) References Cited

U.S. PATENT DOCUMENTS

| 8,378,715 | B2 * | 2/2013 | Or-Bach | H01L 25/0652 |
| | | | | 326/47 |
| 8,445,948 | B2 * | 5/2013 | Fuller | H01L 29/66439 |
| | | | | 257/E21.409 |
| 2011/0232078 | A1 * | 9/2011 | Yun | H01L 22/22 |
| | | | | 29/593 |
| 2013/0241314 | A1 * | 9/2013 | Yun | H01L 25/0657 |
| | | | | 307/125 |

OTHER PUBLICATIONS

3D Week: Wide I/O SDRAM, Network on Chip, Multicore, TSV, Asynchronous Logic—3D SoC stack from CEA-Leti and ST-Ericsson hits all the advanced notes, Dec. 14, 2011.
Gaillardon et al., "Nanowire systems technology and design", [rsta.royalsocietypublishing.org], Phil. Trans. R. Soc. A372: 20130102. http://dx.doi.org/10.1098/rsta.2013.0102.
(Continued)

*Primary Examiner* — Anh Q Tran
(74) *Attorney, Agent, or Firm* — Moser Taboada

(57) ABSTRACT

According to an aspect of the present inventive concept there is provided 3D IC, comprising:
  a plurality of logic cells stacked on top of each other, each logic cell forming part of one of a plurality of vertically stacked device tiers of the 3D IC, and each logic cell comprising a network of logic gates, each logic gate comprising a network of horizontal channel transistors,
wherein a layout of the network of logic gates of each logic cell is identical among said logic cells such that each logic gate of any one of said logic cells has a corresponding logic gate in each other one of said logic cells, and
wherein each logic cell comprises:
  a single active layer forming an active semiconductor pattern of the transistors of the logic gates of the logic cell, and
  a single layer of horizontally extending conductive lines comprising gate lines defining transistor gates of the transistors, and wiring lines forming interconnections in the network of transistors and in the network of logic gates of said logic cell.

10 Claims, 10 Drawing Sheets

(56) References Cited

OTHER PUBLICATIONS

Mostafizur et al., "Sky bridge 3-D Integrated Circuit Technology Alternative to CMOS", https://www.researchgate.net/publication/261324804_Skybridge_3D_Integrated_Circuit_Technology_Alternative_to_CMOS, Apr. 2014, pp. 1-52.

Guler et al. "Hybrid Monolithic 3-D IC Floorplanner", [http://www.ieee.org/publications_standards/publications/rights/index.html for more information], IEEE Transactions on Very Large Scale Integration (VLSI) Systems, vol. 26, No. 10, Oct. 2018.

Macha et al., "New 3-D CMOS Fabric with Stacked Horizontal Nanowires", Department of Computer Science & Electrical Engineering, University of Missouri Kansas City, MO, USA, IEEE Transactions on Computer-Aided Design of Integrated Cirucuits and Systems, vol. 38, Issue: 9, Sep. 2019, DOI: 10.1109/TCAD.2018.2848588.

\* cited by examiner

3D INTEGRATED CIRCUIT

TECHNICAL FIELD

The present inventive concept relates to a 3D integrated circuit. The present inventive concept further relates to a method for forming a 3D integrated circuit.

BACKGROUND

The constant strive to provide more compact and efficient integrated circuits has led to the development of non-planar transistor designs offering improved electrical performance, and allowing an increased number of transistors per area unit. Examples include FinFETs as well as horizontal channel nanowire- and nanosheet-FETs. Further miniaturization of transistors is feasible from the manufacturing view point, but it is however becoming increasingly costly and challenging to obtain also sufficient system-level performance, area scaling and energy gains to motivate the growing investments.

Three-dimensional integrated circuits (3D IC) have been proposed as an alternative to conventional 2D circuits. 3D ICs are based on the idea of stacking transistor devices or integrated circuits on top of each other, and forming interconnections between the devices/circuits along the vertical direction. According to a conventional integration process for 3D IC fabrication, known as "parallel 3D" or "chip-stacking", separately processed wafers or dies may be stacked and interconnected by Through Silicon Vias (TSVs). According to an alternative approach, known as "sequential 3D integration", wafers or dies may be bonded and processed sequentially, and interconnected by conventional vias.

Parallel 3D allows stacking of several circuits. However, the relatively large footprint of TSVs limit the interconnection density. Sequential 3D integration allows greater via densities but has only been demonstrated to be cost-effective for a small number of tiers (e.g. two). Increasing the number of tiers remains challenging as the bottom tier limits the thermal budget for fabrication of subsequent tiers. Additionally, an increased number of device tiers will require a corresponding increase in mask number and process steps, hindering rational and cost-effective fabrication of such many-layer 3D ICs.

SUMMARY

In view of the above, an objective of the present inventive concept is to provide a 3D integrated circuit ("3D IC") with a design allowing a rational and cost-effective realization. It is a further or alternative objective to provide a 3D IC facilitating a greater number of device tiers than allowed by state of the art designs. It is a further or alternative objective to provide a 3D IC which may be realized with a plurality of device tiers employing a simple and comparably small set of masks and process steps. Further and alternative objectives may be understood from the following.

According to an aspect of the present inventive concept there is provided a 3D IC comprising a plurality of logic cells stacked on top of each other. Each logic cell forms part of one of a plurality of vertically stacked device tiers of the 3D IC. Each logic cell comprises a network of logic gates. Each logic gate comprises a network of horizontal channel transistors (hereafter referred to as "transistors"). A layout of the network of logic gates of each logic cell is identical among said logic cells, such that each logic gate of any one of the logic cells has a corresponding logic gate in each other one of the logic cells. Furthermore, each logic cell comprises a single active layer forming an active semiconductor pattern of the transistors of the logic gates of the logic cell. Each logic cell further comprises a single layer of horizontally extending conductive lines comprising gate lines defining transistor gates of the transistors, and wiring lines forming interconnections in the network of transistors and in the network of logic gates of the logic cell.

The combination of using logic cells stacked on top of each other and with identical logic gate network layouts based on horizontal channel transistors, and each layout comprising a single layer of horizontally extending conductive lines, enables a 3D IC which may be realized in a rational and cost-effective manner, even for a plurality of device tiers such as 8, 16, 32 or more.

Whereas conventional 3D ICs may be fabricated by stacking separately processed wafers (as in parallel 3D integration) or sequentially stacking and processing wafers (as in sequential 3D integration), the inventive design of the present 3D IC enables a more rational process flow which may be scaled to greater number of device tiers. As will be further described herein, the inventive device design in particular allows the logic cells of the device tiers to be processed in parallel, e.g. "in a single shot", where all device tiers are processed simultaneously for any specific process step (e.g. etching or deposition with a given mask instance). This approach is in a sense reminiscent to a 3D NAND Flash integration flow. In particular, the 3D IC may be a monolithic 3D IC in the sense that the plurality of logic cells may be formed or arranged on a single common substrate of the 3D IC.

The horizontally extending conductive lines (i.e. gate lines and wiring lines) of each respective logic cell are of a single layer of each respective logic cell. Thus, within the respective single layer of each logic cell, no conductive line of said respective single layer may extend across any other conductive line of said respective single layer.

A related advantage of the identical layouts of the logic cells and the single layer of conductive lines is that the device may be realized using a comparably small set of masks. In contrast, conventional 3D IC fabrication will require a different set of masks for each device tier. The identical layout of the network of logic gates of the logic cells, allows fabrication with a reduced set of masks.

As used herein, the term "logic gate" refers to (a portion of) circuitry configured to implement a Boolean or logic function. A logic gate may either be a single logic gate or a compound logic gate.

As used herein, the term "logic cell" refers to (a portion of) circuitry of a respective device tier which comprises the network of logic gates. A logic cell is accordingly configured to implement the (compound) function defined by the network of logic gates of the logic cell.

As used herein, the terms "logic cells stacked on top of each other" or "stack of logic cells" refers to a vertical arrangement of logic cells on top of each other. In other words, a stack of logic cells implies a vertical repeating structure of logic cells.

As used herein, the term "device tiers of the 3D IC" refers to the respective (vertical) tiers or levels of the 3D IC.

As used herein, the term "layout of the network of logic gates" refers to the horizontal layout of the network of logic gates of the logic cell, i.e. the layout of the network of logic gates within a plane of the device tier comprising the logic cell. The layout refers to the location and orientation of each logic gate of the network, and the extension of each interconnecting wire of the network.

That the layouts of the network of logic gates of each logic cell are "identical", means that the network of logic gates of each logic cell has, i.e. is arranged according to, a same layout. Each logic gate of a logic cell has a corresponding logic gate in all other logic cells of the stack of logic cells, wherein the corresponding logic gates overlay each other. Furthermore, each conductive line (gate line or wiring line) in a network of logic gates of a logic cell (or in a network of transistors of a logic gate of the logic cell) have a corresponding conductive line (gate line or wiring line) in in the network of logic gates of all other logic cells of the stack of logic cells (or in a network of transistors of a corresponding logic gate in all other logic cells), wherein the corresponding interconnecting wires overlay each other.

As used herein, the term "single layer of horizontally extending conductive lines" refers to a set of conductive lines extending in a common horizontal plane. The common horizontal plane may be a horizontal plane within a respective device tier. As both the gate lines and the wiring lines are configured to route signals within the logic cell and the logic gates thereof, the single layer of conductive lines formed by the gate lines and the wiring lines may be referred to as a single routing layer of the logic cell.

As used herein, the term "single active layer forming an active semiconductor pattern of the transistors" refers to a pattern of active semiconductor structures (e.g. comprising channel regions and source/drain regions of the transistors) extending in a common horizontal plane. As may be appreciated the common horizontal plane associated with the active (semiconductor) pattern may be offset and parallel to the horizontal plane associated with the single routing layer. The single routing layer may be arranged on top of the single active layer (i.e. within each logic cell).

As used herein, the term "horizontal" refers to an orientation or direction parallel to a main plane of extension of any one of the device tiers. Alternatively, the term "horizontal" may be understood as an orientation or direction parallel to a main plane of extension of a substrate of the 3D IC. Conversely, the term "vertical" refers to an orientation or direction perpendicular to a horizontal plane, or parallel to stacking direction of the logic cells/device tiers. Thus, "horizontal" and "vertical" are orientations/directions relative to the 3D IC and do not refer to absolute spatial orientations/directions.

As used herein, the term "extending across", such as in a first structure (e.g. first gate or wiring line) extending across a second structure (e.g. second gate or wiring line), means that the first structure extends to, across and past the second structure.

Accordingly, in relation to a first and second structure arranged in a same layer (i.e. extending in a same horizontal plane), the first structure extending across the second structure means that the first structure extends across and through second structure. In other words, there will be a (non-zero) intersection (i.e. a common body) of the first and second structure at the crossing between the first and second structure. Accordingly, the wording "no conductive line of a layer extending across any other conductive line of the single layer" means that no conductive line of the single layer extends across and through another conductive line of the layer. For brevity, an arrangement of "no conductive line of a layer extending across any other conductive line of the layer" may in the following for brevity be referred to as a "no-crossing arrangement/design".

On the other hand, in relation to a first structure arranged in a first layer and extending across a second structure in a second layer under (or over) the first layer, the first structure extending across the second structure means that the first structures extends across and over (or under) the second structure. In other words, there will be no (non-zero) intersection (i.e. no common body) of the first and second structure at the crossing between the first and second structure. Put differently, the first structure may extend across the second structure by running above or under the second structure.

The inventive 3D IC is applicable to various types of logic circuits, including but not limited to arithmetic and logic cores, multiplier arrays, arithmetic logic units (ALUs) and vertical memory arrays such as stacked static random access memory (SRAM) cells.

The types of logic gates of the logic cells may vary depending on application. Generally, each logic gate may be a logic gate of a respective type selected from the group comprising: NOT, AND, OR, NAND, NOR, EXOR, MUX.

According to embodiments, each one of the logic cells may form a 1-bit module of an N-bit arithmetic and logic core or multiplier array. The 3D IC may hence be used to implement an N-bit (modular) arithmetic and logic core, where the logic cell of each respective device tier is configured to implement 1 bit of the arithmetic and logic core. According to embodiments, each one of logic cells may form a 1-bit module of an N-bit ALU.

According to embodiments, the network of logic gates of each logic cell may comprise a set of primary input logic gates configured to receive a set of primary input signals to the logic cell, and a primary output logic gate configured to output a primary output signal from the logic cell. Hence, each logic cell may be configured to apply a compound logic function (as defined by the network of logic gates of the logic cell) to the set of primary input signals and provide a primary output signal. The set of primary input logic gates hereby refers to the set of logic gates of the logic cell first receiving the primary input signals to the logic cell. Correspondingly, the primary output logic gate refers to a last logic gate of the logic cell providing a resulting output signal to circuitry outside the logic cell.

The primary input logic gates and the primary output logic gate of each respective logic cell may be located at a periphery of the respective logic cell. This may facilitate access to the primary output and input logic gates from outside of the respective logic cell.

According to embodiments, the 3D IC may further comprise a set of vertical power rails common for the logic cells of the device tiers, each power rail formed by a via extending vertically through stack of logic cells, i.e. through the logic cells of the device tiers. Utilizing the vertical dimension for the power rails may reduce wiring congestion within the single metal routing layers of each device tier. The power rails may be connected to logic gates of the logic cells.

According to embodiments, the 3D IC may further comprise:

an input staircase structure arranged at a side of the stack of logic cells and comprising an input tier for each one of the plurality of device tiers, each input tier comprising a set of horizontally extending input wires connected to the set of primary input logic gates of the logic cell of the respective device tier;

a respective set of vertical input contacts for each input tier of the input staircase structure, each input contact connected to a respective input wire of the respective input tier.

The 3D IC may further comprise:

an output staircase structure arranged at a side of the stack of logic cells and comprising an output tier for each one of the plurality of device tiers, each output tier comprising a horizontally extending output wire connected to the primary output logic gate of the logic cell of the respective device tier; and a vertical output contact for each output tier of the output staircase structure, each output contact connected to an output wire of the respective output tier.

The use of input and output staircase structures may facilitate accessing the logic cell of each respective device tier, without interfering with logic cells of higher or lower device tiers. Moreover, the staircase structures allow vertical routing of primary input and output signals to/from each device tier. Utilizing the vertical dimension for the input and output signals may reduce wiring congestion within the single metal routing layers of each device tier.

According to embodiments comprising both an input and output staircase structure, the input and output staircase structures may be arranged at different sides of the stack of logic cells, such as on opposite sides thereof.

Alternatively, the 3D IC may comprise a combined input-output staircase structure, comprising an input-output tier for each one of the plurality of device tiers, each input-output tier comprising a set of horizontally extending input and output wires connected to the primary input and output logic gates, respectively, of the logic cell of the respective device tier. The 3D IC may further comprise a respective set of vertical input and output contacts for each input-output tier of the input staircase structure, each input contact and output contact connected to a respective input wire and output wire, respectively, of the respective input tier.

Each vertical input contact may be formed by a respective via ("input via"), the (input) vias extending from a common control plane to an input wire of a respective one of the device tiers.

Correspondingly, each vertical output contact may be formed by a respective via ("output via"), the (output) vias extending from a common control plane to an output wire of a respective one of the device tiers.

The common control plane may be arranged in a device tier (which may be referred to as a "control tier") located above a top- or bottom-most logic cell of the stack of logic cells.

According to a further aspect of the present inventive concept, there is provided a method for forming a 3D IC comprising a stack of logic cells, each logic cell forming part of one of a plurality of device tiers (e.g. vertically stacked device tiers) of the integrated circuit, the method comprising:

patterning a layer stack comprising, for each device tier, in a bottom-up direction, an active semiconductor layer, a sacrificial layer and an interlayer-dielectric layer, the patterning comprising forming trenches in the layer stack, and wherein the layer stack by the patterning is partitioned into a plurality of sub-stacks comprising, for each device tier, an active semiconductor layer portion, a sacrificial layer portion and an inter-layer dielectric portion;

removing the sacrificial layer portions in each device tier of each sub-stack;

forming a gate stack in spaces formed by removing the sacrificial layer portions, the gate stack comprising a gate dielectric and gate electrode material forming gate lines;

recessing the gate lines from the trenches to form cavities on each side of each recessed gate line;

depositing a spacer material in said cavities to form spacers along each recessed gate line; and forming source/drain regions on end surfaces of the active semiconductor layer portions facing the trenches.

The inventive method enables a stack of logic cells to be fabricated in "a single shot", as discussed above. More specifically, the method enables forming a 3D IC as per the aspect set out above. The advantages and details discussed in connection with the preceding aspect and embodiments thereof accordingly apply correspondingly to the method aspect.

It should be appreciated that each the method steps may be applied to each device tier comprising a logic cell in parallel, i.e. simultaneously.

For example, the sacrificial layer portions in each device tier of each sub-stack may be removed simultaneously, e.g. by an etching process selective to the (material of the) sacrificial layer portions.

For example, the gate stacks of each device tier may be formed simultaneously, e.g. by a conformal deposition of gate dielectric and a subsequent conformal deposition of gate electrode material.

According to embodiments, forming the trenches may comprise etching of the layer stack while using a hard mask defining a trench pattern as an etch mask.

According to embodiments, forming the gate stack may comprise conformally depositing a gate dielectric and conformally depositing gate electrode material, and etching to remove gate electrode material deposited in the trenches. The trenches may be re-etched (again) using the same aforementioned hard mask as used for forming the trenches.

According to embodiments, forming the spacers may comprise conformally depositing the spacer material and subsequently removing spacer material deposited outside the cavities by etching.

According to embodiments, the method may further comprise, prior to removing the sacrificial layer portions of each sub-stack, forming a set of one or more support walls of insulating material, wherein each sub-stack is formed in abutment with at least one support wall of the set of supporting walls. Thereby the active layer portions and the dielectric-layer portions of each sub-stack may be suspended above the spaces (i.e. formed by removing the sacrificial layer portions).

According to embodiments, forming the set of one or more support walls may comprise forming at least one tall support wall extending vertically through the layer stack. The tall support wall may accordingly protrude from/be supported by the substrate.

Each tall support wall may be formed by etching a respective wall trench extending through the layer stack and filling the wall trench with insulating material.

According to embodiments, forming the set of one or more support walls may comprise forming short support walls, each short support wall bridging a gap between a pair of inter-layer dielectric portions of neighboring sub-stacks (i.e. the pair of inter-layer dielectric portions being located in in a same device tier). The short support walls may be formed by selectively depositing dielectric material on sidewalls of the inter-layer dielectric portions of the sub-stacks.

The patterning of the layer stack may further comprise, prior to forming said trenches (e.g. a "second" set of trenches), forming an initial set of trenches in the layer stack. Forming the short support walls may comprise depositing the dielectric material on sidewalls of the inter-layer dielectric portions facing the initial set of trenches and on sidewalls of the inter-layer dielectric portions facing the second set of trenches. Dielectric material deposited in the second set of trenches may be removed from the second set of trenches by etching. That is, the second set of trenches may be re-etched (again) using the same aforementioned hard mask as used for forming the (second set of) trenches.

According to embodiments, forming the source/drain regions may comprise epitaxially growing the source/drain regions on end surfaces of the active semiconductor layer portions facing the trenches.

According to embodiments, the method may further comprise:

merging inter-layer dielectric portions of neighboring sub-stacks by selectively depositing a dielectric on sidewalls of the inter-layer dielectric portions, thereby creating horizontally extending wiring cavities for wiring lines in each device tier. The method may further comprise filling the wiring cavities with a conductive material to form the wiring lines.

The inter-layer dielectric portions may be merged after forming the source/drain regions.

According to embodiments, the method may further comprise forming vertical holes wherein each wiring cavity communicates with a respective hole. The wiring cavities may be filled via the filling holes.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

The following disclosure pertains to a 3D IC comprising a plurality of logic cells with identical layout stacked on top of each other. The 3D IC may be realized as a monolithic multi-tiered logic circuit device.

Figure 1:
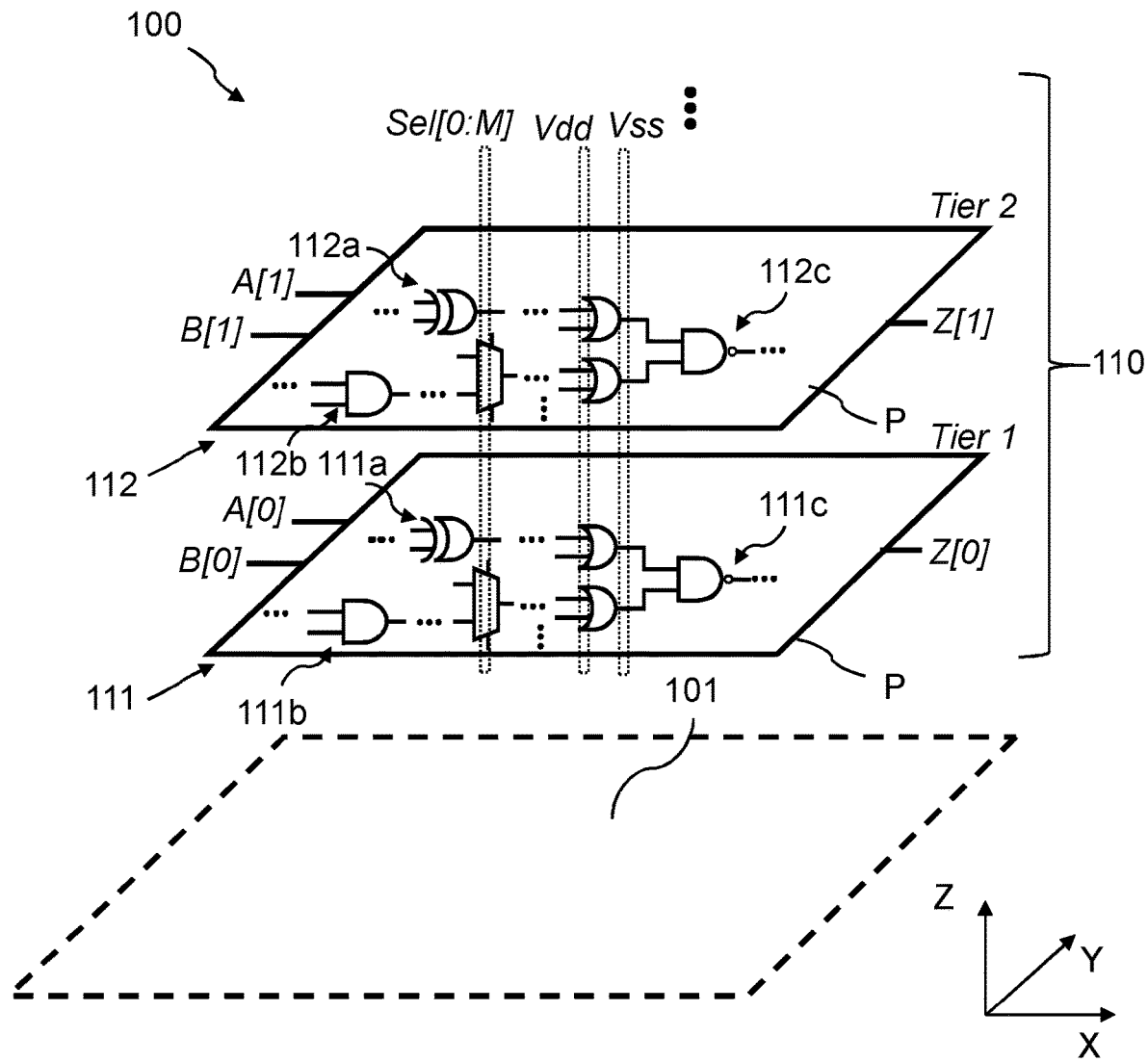
FIG. 1 is a schematic perspective view of a 3D IC.

FIG. 1 schematically depicts a 3D IC 100. Axes X and Y indicate respectively a first and a second horizontal direction. Axis Z indicates a vertical or bottom-up direction (normal to the horizontal plane XY).

The 3D IC 100 comprises a stack of logic cells, commonly referenced 110 and comprising logic cells 111, 112. The logic cells 110 are stacked on top of each other, along the vertical direction Z. Each logic cell 110 forms part of a respective one of a plurality of device tiers of the 3D IC 100, in the figure denoted "Tier 1", "Tier 2". FIG. 1 only shows two device tiers and logic cells however may more generally comprise N logic cells wherein N is 2 or greater, such as 4, 8, 16 or more. It may further be noted that the 3D IC 100 may comprise further device tiers not comprising logic cells 110, e.g. located above or below the stack of logic cells 110. The 3D IC 100 may as shown further comprise a substrate 101, supporting the device tiers and the stack of logic cells 110. The horizontal and mutually parallel main planes of extension of the substrate 101 and the device tiers/logic cells 110 are visible in FIG. 1.

Each logic cell 110 comprises a network of logic gates, schematically indicated by example sets of logic gates comprising e.g. logic gates 111a-c and 112a-c or logic cells 111 and 112, respectively. Each logic cell 110 may more generally comprise or be constituted by a set of logic gates, each logic gate being of a respective type selected from a group comprising: NOT, AND, OR, NAND, NOR, EXOR, MUX. This is however not an exclusive listing of possible types of logic gates and other types are also possible. The actual selection of types of logic gates 110 will as may be appreciated vary with the (compound) logic function which is to be implemented, and the intended application of the 3D IC 100. The logic cells 110 may for example be configured to implement arithmetic functions, logic functions, or combinations thereof. The logic cells 110 may form 1-bit modules of an N-bit arithmetic and logic core or multiplier array, wherein the 3D IC may be configured to implement an N-bit (modular) arithmetic and logic core or ALU. Other examples include logic cells configured as memory cells, such as SRAM memory cells.

Each logic gate 111a-c, 112a-c in turn comprises or may be constituted by a network of horizontal channel transistors, wherein "horizontal" refers to the direction of the flow of charges through the respective channels of the transistors being along the horizontal plane XY. In other words, the channel region of each transistor extends horizontally between a source region and a drain region, at mutually opposite sides of the channel region. The number of transistors and configuration of network of transistors for a logic gate will as may be understood vary with the type of logic gate.

Each logic cell 110 comprises a single active layer which forms an active semiconductor pattern of the transistors of the logic gates (e.g. 111a-c and 112a-c) of the logic cell 110. As will be further described herein, the active semiconductor pattern may comprise a number of semiconductor channel regions (e.g. one for each transistor), each channel region located between a source region and a drain region. The source and drain region may be epitaxially grown regions, on either side of a respective channel region.

Each logic cell 110 further comprises a single layer of horizontally extending conductive lines comprising (horizontally extending) gate lines defining transistor gates of the transistors, and (horizontally extending) wiring lines forming interconnections in the networks of transistors of each logic gate and in the network of logic gates of said logic cell. That is, the set of horizontally extending conductive lines refers to the single exclusive set of horizontal conductive lines of each logic cell 110. In other words, all horizontally extending conductive lines of each logic cell 110 (i.e. gate lines and wiring lines) are arranged to extend in a common horizontal plane of the respective logic cell 110. Each common horizontal plane should hereby be understood as a respective common geometric horizontal plane, e.g. located within the device tier (e.g. Tier 1 or Tier 2) comprising the respective logic cell (e.g. logic cell 111 or logic cell 112).

Due to the single layer arrangement of the horizontally extending conductive lines of each logic cell 110, there is in each device tier comprising the respective logic cell 110 no additional higher-level layer with wiring lines available for routing within a logic cell 110 of the device tier. As a consequence, no conductive line (gate line or wiring line) of the single layer of a logic cell 110 may extend across and through any other conductive line (gate line or wiring line) of said single layer (i.e. the "no-crossing design"). In other words, a signal path between any pair of nodes in a network of logic gates or transistors of a logic cell which signal path is provided by a first conductive (gate or wiring) line of the single (routing) layer of the logic cell, may not extend across and through a signal path between any other pair of nodes in the network of logic gates or transistors of the logic cell which signal path is provided by a second conductive (gate or wiring) line of the single (routing) layer of the logic cell. For example, a first wiring line extending from an output of a first logic gate of a logic cell 110 to an input of a second logic gate of a logic cell 110 may extend across neither: a second wiring line of the logic cell 110 (e.g. extending from an output of a third logic gate of the logic cell 110 to an input of a fourth logic gate of the logic cell 11) nor a gate line defining a gate of a transistor of (a logic gate of) the logic cell 110.

In each logic cell 110, the single layer of conductive lines may be formed adjacent the active layer of the logic cell 110. The single layer may for example be arranged on top of the active layer comprising the active semiconductor pattern. The gate lines may hence be arranged to extend across and over (i.e. run above) channel regions of the active semiconductor pattern. It is to be understood that at each crossing between a gate line and a channel region, a gate dielectric may be arranged in-between, as an interfacial layer. The wiring lines may be arranged to extend across and over (i.e. run above) source/drain regions of the active semiconductor pattern such the wiring lines abut the source/drain regions at the crossings. A wiring line may accordingly be electrically connected to a source/drain region, e.g. by forming an ohmic or Schottky contact thereon.

It should be noted that the "no-crossing design" of each single layer of horizontally extending conductive lines applies not only to inter-logic gate connections within a logic cell 110, but also to intra-logic gate connections, i.e. wiring lines and gate lines in the network of transistors of each logic gate of the logic cell 110.

It should further be noted that, depending on the exact layout of a logic cell 110, not all inter-transistor or inter-logic gate connections within a logic cell need be provided by a gate line or wiring line of the routing layer. An inter-transistor or inter-logic gate connection may also be provided by the active pattern, such as by abutting/shared source/drain regions of a pair of transistors.

It should further be noted that the "no-crossing design" of the single layer does not rule out presence of branching points in a network of logic gates or transistors wherein a first line joins or merges with a second line, provided that the first line does not extend through and past the branching point. An example of such a branching point would be a first wiring line extending from an output of a first logic gate of a logic cell 110 to an input of a second logic gate of the logic cell 110, and a second wiring line extending from a branching point along the first wiring line to an input of a third logic gate of the logic cell 110. The output of the first logic gate 110 may accordingly be connected to the inputs of both the second and third logic gates.

As further indicated in FIG. 1, the layout of the network of logic gates is identical among the logic cells 110. The layout of a logic cell 110 defines or refers to the position (and orientation) of each component (e.g. logic gate or transistor), and the horizontal extension of the conductive lines (e.g. gate lines or wiring lines). Correspondingly, although not visible in the gate-based schematic of FIG. 1, a layout of the network of transistors of each logic gate is further identical among the corresponding logic gates. During the design phase, the layout of the logic cells 110 may be defined in a netlist. Hence, the wording "identical layouts" may imply "identical netlists".

By the identical layout of the respective networks of logic gates of the logic cells 110, each logic gate of any one of the logic cells 110 has a corresponding or counter-part logic gate in each other one of said logic cells. For example, the logic gate 111a of the logic cell 111 has a corresponding logic gate 112a of the logic cell 112. The logic gate 112a overlays the logic gate 111a. That is, the horizontal position of the logic gate 111a (relative to the logic cell 111) and the horizontal position of the logic gate 112a (relative to the logic cell 112) are the same such that the logic gate 112a is arranged directly above the logic gate 111a. This applies correspondingly to any further logic gates of the logic cells 111 and 112, such as logic gate 111b of logic cell 111 having a corresponding logic gate 112b of logic cell 112, and logic gate 111c of logic cell 111 having a corresponding logic gate 112c of logic cell 112.

The network of logic gates of each logic cell 110 may comprise a set of primary input logic gates configured to receive a set of primary input signals to the respective logic cell 110. The network of logic gates of each logic cell 110 may further comprise an output logic gate configured to output a primary output signal from the respective logic cell 110.

In FIG. 1, the primary input signals to the logic cells 111 and 112 are indicated by A[0], B[0] and A[1], B[1], respectively, and the primary input logic gates of the logic cells 111, 112 are formed by the logic gates in the network of logic gates of the respective logic cells 111, 112 first receiving the respective primary input signals. Meanwhile, the primary output signals from the logic cells 111 and 112 are indicated by Z[0] and Z[1], respectively, and the primary output logic gate of the logic cells 111, 112 is formed by the logic gate in the network of logic gates of the logic cell 110 providing the resulting output signal Z[0] and Z[1]. Hence, the primary output logic gate of each logic cell 110 is the logic gate last receiving a signal propagating through the network of logic gates of the logic cell 110.

The primary input logic gates and the primary output logic gate of each respective logic cell 111, 112 may be located at a periphery of the respective logic cell, indicated by P in FIG. 1. The primary input logic gates may for example be located at a first side of the respective logic cell 110 and the primary output logic gate may be located at a second side of the respective logic cell 110, opposite the first side. This may in some cases facilitate the and routing of interconnecting wires. However, other configurations are also possible, such as the primary input and output logic gates being located at a same side of the respective logic cell, or at adjoining sides of the logic cell.

Since the layouts of the logic cells 110 are identical it is to be understood that the primary input logic gates and the primary output logic gates are arranged at a same respective position (and with a same orientation) within each respective logic cell 110.

The number of primary inputs of each logic cell 110 may as for the illustrated 3D IC 100 for example be two, however may more generally depend on the actual function of the logic cell. The number of primary outputs of each logic cell 110 may as for the illustrated 3D IC 100 for example be one, however may more generally depend on the actual function of the logic cell.

As will be further described herein, one or more of the primary inputs to each logic cell 110 may be duplicated. For example, two logic gates in the network of logic gates of logic cell 111, and 112, respectively, may be configured to receive a same primary input signal, e.g. A[0] and B[0], respectively). The two logic gates receiving the same primary input may be of a same or different type (e.g. NOT, AND, OR, NAND, NOR, EXOR, MUX). This may facilitate realizing the networks of logic gates without departing from the non-crossing design of the single layer.

In a memory application, such as memory cells 110 configured as SRAM memory cells, the primary inputs/outputs of each logic cell 110 may instead be received/provided by e.g. pass gates connected to bit lines or complementary bit lines of a memory array.

As further shown in FIG. 1, the 3D IC 100 may further comprise a set of power rails, indicated by VSS and VDD. The power rails may be common for, i.e. shared by, the logic cells 110 of the device tiers. Each power rail may be formed as a via extending vertically through the logic cells 110 of the device tiers. The term "via" should herein be understood as a vertically extending conductive structure, e.g. a conductive "vertical pillar", wherein "vertical" denotes an elongation along the vertical direction Z. The power rails may be connected to transistors of the logic gates of the logic cells 110, e.g. pull-up and pull-down transistors of the logic gates. The power rails may comprise both pull-up rails connected to pull-up voltage supplies or current sources (VDD) and pull-down rails connected to pull-down voltage supplies or current sinks VSS or ground GND.

The power supplies VDD, VSS represent global signals, in the sense that they are shared by the logic cells 110 of all device tiers, performing a same logic function. The power rail vias may accordingly be arranged to extend through the device tiers and the logic cells 110 at desired locations, without adding to the (horizontal) routing complexity within each logic cell 110.

As further shown in FIG. 1, the 3D IC 100 may further comprise one or more control signal vias, indicated by Sel[0:M]. Examples of control signals include global selection signals for configuring arithmetic and logic cores or ALUs.

Figure 2:
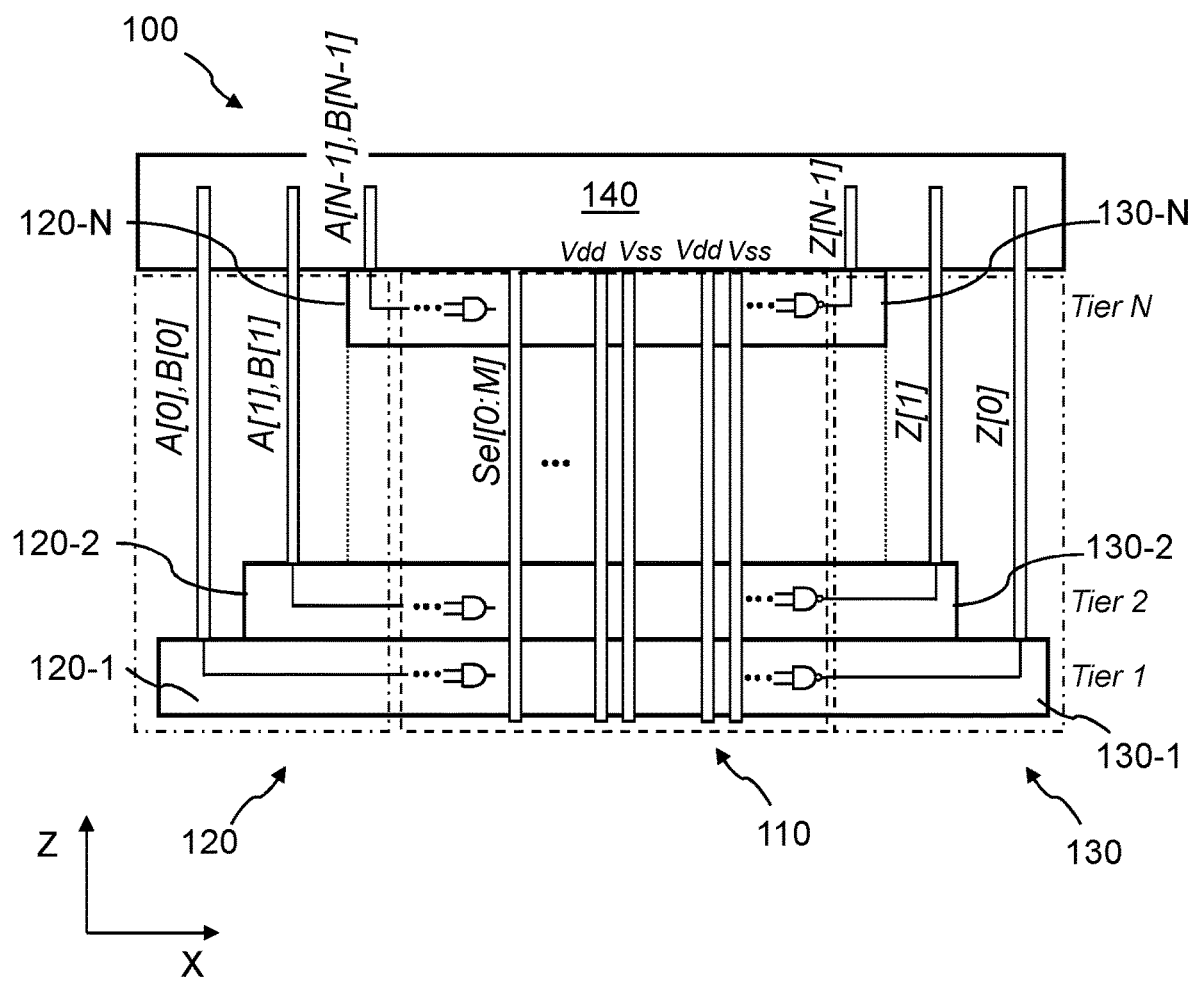
FIG. 2 is a schematic side view of a 3D IC.

FIG. 2 is a schematic sideview of the 3D IC 100 comprising a stack of N logic cells 110 distributed among N device tiers. The dashed box surrounding the stack 110 indicates the vertical extension of the stack of logic cells 110 and the horizontal extension of the logic cells 110 within their respective device tiers.

FIG. 2 further shows a control plane 140. The control plane 140 may comprise control circuitry arranged in one or more device tiers above the stack of logic cells 110, e.g. in device tiers N+1 and higher. The control plane 140 may be configured to distribute the global signals (e.g. Sel[0:M], VDD, VSS) to the logic cells 110, discussed above. Although not shown in FIG. 2, parts of the control circuitry of the 3D IC 100 may be arranged below and/or to the sides of the stack of logic cells 110. For example, the control circuitry may comprise active devices formed on the supporting substrate (substrate 101 in FIG. 1) using conventional front-end-of-line techniques, and connected to higher-level control circuitry of the control plane 140 through a conventional back-end-of-line interconnect structure formed in regions outside the region illustrated in FIG. 2.

The 3D IC 100 may as further shown in FIG. 2 comprise an input staircase structure 120. The input staircase structure 120 is configured to allow input signals to be provided individually to the logic cells 110 of the different device tiers.

The input staircase structure 120 may comprise N input tiers 120-1 through 120-N, one tier for each logic cell 110 and device tier 1 through N. Each input tier forms a respective step of the input staircase structure 120. That is, each input tier j protrudes laterally outside each higher-level input tier k, where $1 \leq j \leq N-1$ and $j+1 \leq k \leq N$.

As indicated in FIG. 2, each input tier 120-1 through 120-N comprises a respective set of horizontally extending input wires connected to inputs of the logic cell 110 of the respective device tier. The input wires may for example be connected to primary input logic gates of the logic cells 110. The respective (primary) input signals A[0], B[0]; A[1], B[1]; . . . A[N], B[N] for each logic cell 110 may as shown be supplied via a respective set of vertical input contacts provided for each input tier of the input staircase structure 120. Each input contact may be connected to a respective input wire of the respective input tier. Each vertical input contact may be formed by a via extending from the common control plane 140 to connect (e.g. by landing on) a respective input wire.

The 3D IC 100 may as shown in FIG. 2 further comprise an output staircase structure 130. The output staircase structure 130 is configured to allow output signals to be individually output from the logic cells 110 of the different device tiers, e.g. to surrounding circuitry.

The description of the input staircase structure 120 is generally applicable also to the output staircase structure 130, which accordingly may comprise N output tiers, one tier for each logic cell 110 and device tier 1 through N, each output tier forming a respective step of the output staircase structure 130 and protruding laterally outside each higher-level output tier. Moreover, each output tier 130-1 through 130-N may comprises a respective set of horizontally extending output wires connected to the output(s) of the logic cell 110 of the respective device tier (e.g. the primary output logic gate(s)) and a respective set of vertical output contacts (e.g. vias) connected thereto such that the respective (primary) output signals Z[0], Z[1], . . . Z[N] may be individually output to surrounding circuitry, e.g. the control plane 140.

As indicated by the dash-dotted boxes surrounding the input and output staircase structures 120, 130, the input and output staircase structures 120, 130 may be arranged adjacent to, and at a side of the stack of logic cells 110, e.g. at mutually opposite sides of the input staircase structure 120. However, this is merely an example and the input and output staircase structures 120, 130 may more generally be arranged on the same side of the stack of logic cells 110 as the primary input logic gates and primary output logic gates, respectively.

The 3D IC 100 shown in FIG. 2 comprises both an input and output staircase structure. It is however contemplated that instead of an input and/or output staircase structure, input/output signals of the logic cells 110 may be input/output from/to a common vertical input/output contact structure, e.g. in a time-distributed fashion.

In some applications (e.g. arithmetic and logic cores, multiplier arrays, ALUs) thereby may be a need for propagating a carry (bit) from the logic cell of one device tier to the logic cell of a next consecutive device tier (e.g. along an upward direction of the stack). Accordingly, each logic cell 110 may in addition to primary inputs and outputs further comprise a carry input and a carry output. The terms "carry input" and "carry output" hereby refers to the input and output nodes, respectively, of the respective logic cell. The actual carry being output and input via the carry output and carry input, respectively, may be referred to as simply "carry" or "carry bit". The carry output and the carry input of a logic cell may be connected to the network of logic gates thereof. The carry output of a logic cell 110 may be provided to the output staircase structure, vertically routed to the control plane 140, and then vertically routed from the control planed 140 to the carry input of a consecutive logic cell 110 via the input staircase structure.

Figure 3:
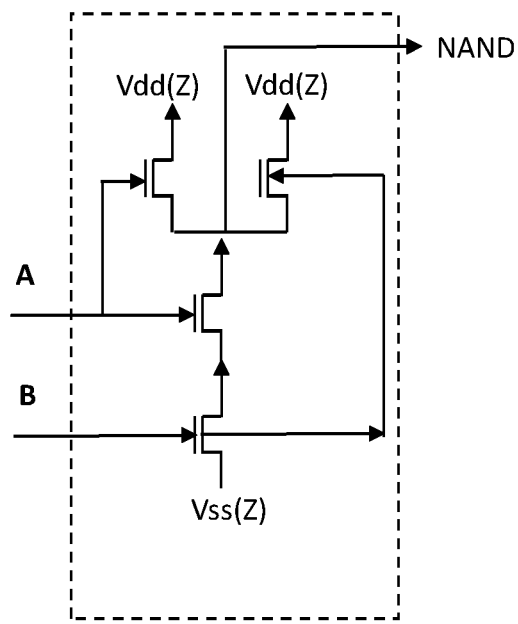
FIGS. 3 and 4 are example circuit diagrams logic gates.

FIG. 3 shows a circuit diagram of an example layout of a network of transistors defining a NAND logic gate, with a layout following the no-crossing design. As suggested by the "Z" suffix to VDD and VSS, the VDD as well as VSS power rails are routed vertically through vias, as discussed above. As may be seen the VDD power rail and pull-up transistor has been duplicated to facilitate a horizontal routing in accordance with the non-crossing design.

Figure 4:
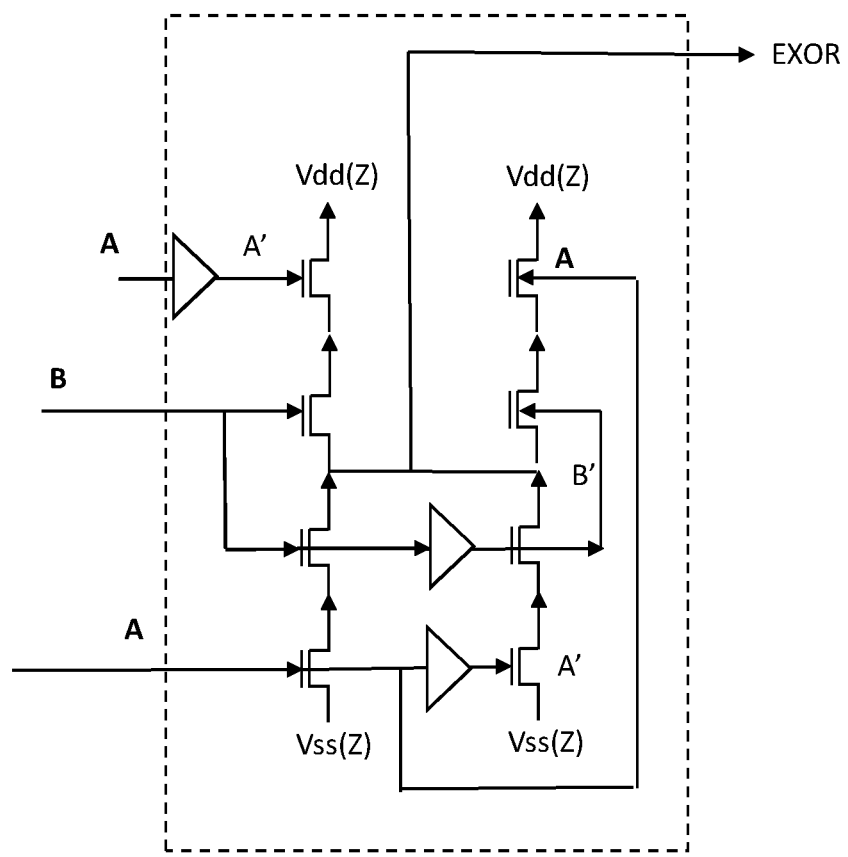

FIG. 4 shows a circuit diagram of an example layout of a network of transistors defining an EXOR logic gate. As indicated, similar to the NAND logic gate of FIG. 3, the EXOR logic gate also relies on vertically routed VDD and VSS power rails. As may be understood this applies also to the power rails for the three inverters (triangular blocks), which however have been omitted to not overly complicate the circuit diagram. To further facilitate a horizontal signal routing in accordance with the non-crossing design "infra-gate", one or more inputs to a given logic gate may be duplicated (similar to the duplication of primary inputs of a logic cell 110 discussed above). This is exemplified by the duplicated logic gate input A.

In both the circuit diagram of FIGS. 3 and 4 additional control inputs which are common to the logic cells may be provided at desired locations by vias extending vertically through the stack of logic cells 110.

An algorithm which may be employed to determine a layout of a logic cell 110 in accordance with the no-crossing design will now be described in conjunction with FIG. 5a-c. The algorithm will be described with reference to a logic cell comprising an AO22 (logic) gate. The algorithm may start from an initial layout or netlist of a logic cell, e.g. an initial customized cell layout or selected from a standard library.

An assumption for the algorithm is that each logic gate intended to form part of the logic cell 110 includes no crossing conductive lines (i.e. the no-crossing design is followed "intra-gate"). Should this not be the case, this may be addressed e.g. by relying on vias for any global signals (e.g. VSS, VDD, global control signals). For complex logic gates, a further option may be to change from a transistor-level based design to a logic gate-level design, i.e. cascading a basic set of logic gates. As a non-limiting example, an AO22 gate may be formed by two AND-gates connected to a respective input of an OR-gate, or two NAND gates connected to a respective input of a third NAND gate. Although a logic gate-level design may result in an increased transistor count, it may considerably simplify the horizontal routing.

Once it has been ensured that the no-crossing design is followed intra-gate, the algorithm may proceed with implementing the no-crossing design inter-gate. This may be performed by "resolving loops" in any wiring between the logic gates of the logic cell.

Figure 5A:
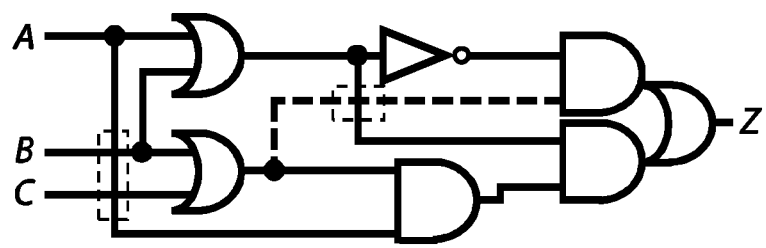
FIG. 5a-c illustrate an algorithm for determining a layout of a logic cell.

As illustrated in FIG. 5a, the input arrangement of the AO22 gate (which forms the primary output logic gate of the logic cell) is causing a crossing of wires. It is not possible to simply move the preceding logic gates to overcome this issue. This crossing can be resolved however by duplicating the OR2 gate (dashed outline in FIG. 5b) on the side. As depicted in FIG. 5b, its output is now able to be connected to the AO22 gate without a crossing. Note that while it brings an area overhead, logic gate duplication may always be used resolve any crossing issue as the gates can be duplicated up to the netlist primary inputs.

Figure 5B:
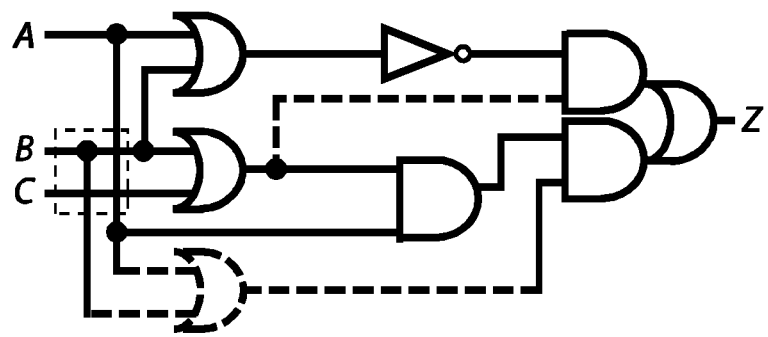
Figure 5C:
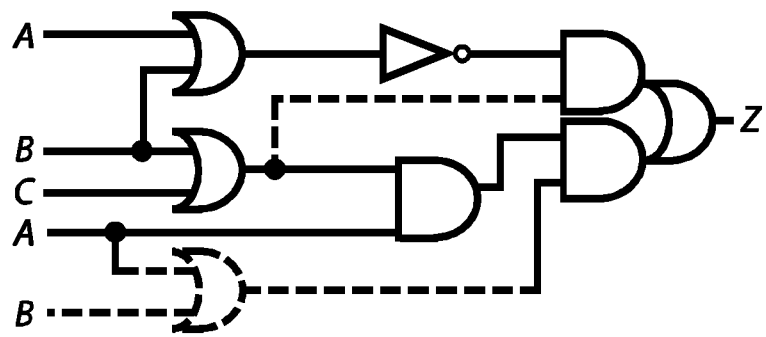

As further shown in FIG. 5b, primary input B is driving three parallel logic gates. However, since there is no way to place them next to each other, the B metal wire has to cross inputs A and C. The primary inputs can however be duplicated to be fed to more logic gates in the logic cell. As depicted in FIG. 5c, by duplicating the primary inputs A and B, both metal crossings can be resolved.

Using an input staircase structure for providing the primary inputs to the logic cells, as discussed above, additional input wires connecting to the primary input logic gates of the logic cell, and respective vertical input contacts may be provided for each device tier, in order to accommodate an increased number of primary input logic gates resulting from the algorithm. As the global signals may be provided through vertical pillars, those can also be easily duplicated as needed.

A straight-forward approach for fabricating the stack of logic cells 110 of the 3D IC 100 would be to form structure sequentially layer-by-layer. The identical layouts of the logic cells 110 may thus enable fabrication using a simple and comparably small set of masks and process steps. Another approach, allowing more rational fabrication than a sequential approach, will now be disclosed with reference to FIGS. 6a-f. In the figures, like fill patterns represent like elements unless stated otherwise.

The processing starts by depositing a layer stack 200 on a substrate 201. The substrate 201 is schematically indicated and may correspond to the substrate 101 discussed in connection with FIG. 1. The layer stack 200 comprises: for each logic cell of each device tier which is to be formed, a stack of an active semiconductor layer 202, a sacrificial layer 204 which will become the gate (dummy-Gate), and an interlayer-dielectric 206. While there are multiple possible options for creating active layers, one option is to use layer transfer of crystalline silicon, as it is done for Silicon On Insulator (SOI) processes. Those SOI-like silicon devices are well understood and have good electrical characteristics. The sacrificial layer 204 may be a nitride-layer, such as silicon nitride, or some other material which may be etched with a sufficient selectivity with respect to the active layer and the inter-layer dielectric. The inter-layer 206 dielectric may be of a conventional inter-layer dielectric, such as silicon oxide.

As noted above, the stack of logic cells 100 may more generally be arranged in N different device tiers. For illustrative clarity, the figures however only shows a layer stack for three device tiers.

Figure 6A:
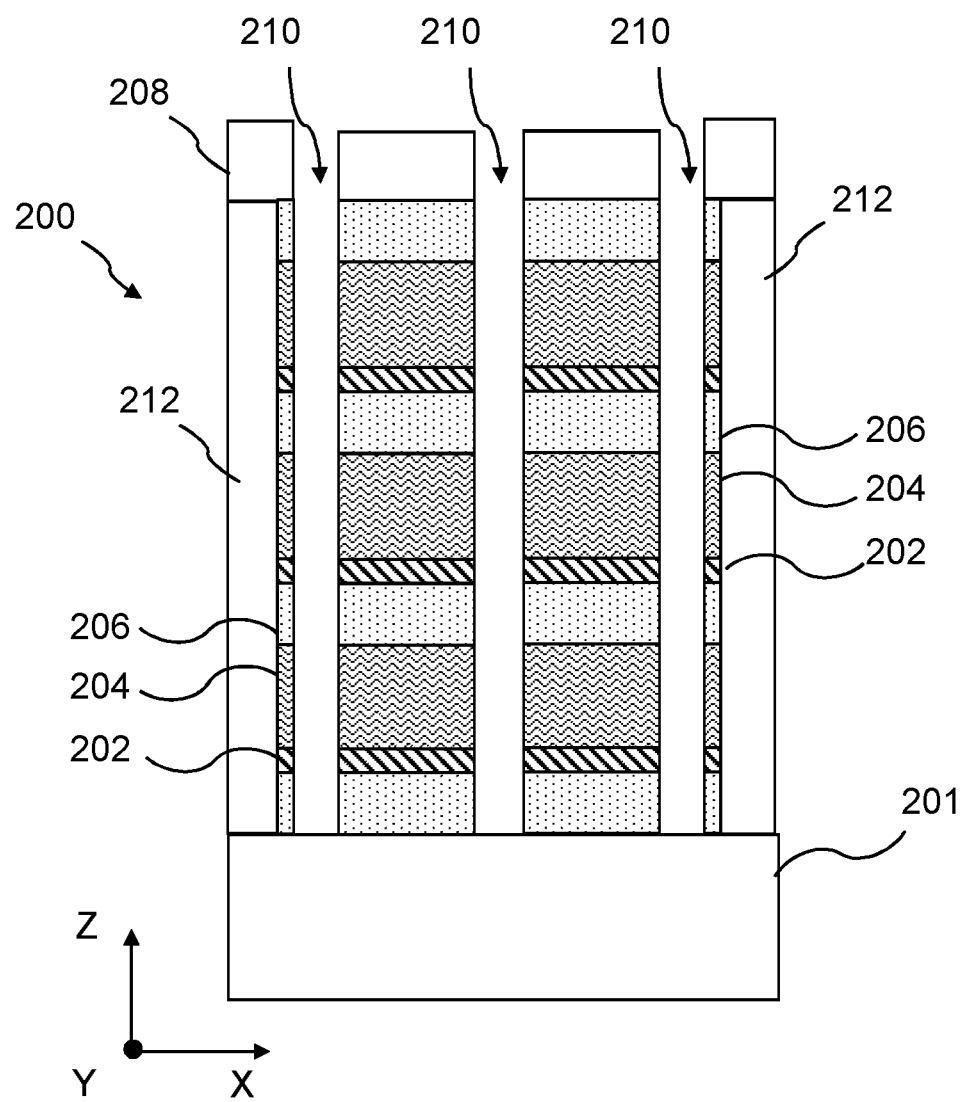
FIG. 6a-f illustrate a method for forming a 3D IC.

The process relies on an indirect fabrication of gates, wherein the gates are formed in a "collateral" fashion. As shown in FIG. 6a, the layer stack 200 is patterned by forming cuts or trenches 210 by etching through the layer stack 200, e.g. at positions where source and drain regions will be formed. A high-aspect-ratio etch may be employed for this purpose, such as a reactive-ion etch or other suitable dry etching process. The cuts 210 may be formed by first forming a trench pattern in a hard mask 208 (e.g. using a litho-etch process) above the layer stack 200 and then etching the layer stack 200 through the trench pattern while using the hard mask 208 as an etch mask. As a result of the cuts 210, the stack of layers may be partitioned into a number of sub-stacks separated by trenches, which also may be referred to as "gate-" or "channel-islands". Each island may comprise channel region portions remaining of the active layer with a sacrificial layer portion (or "dummy-gate portion"), and an interlayer-dielectric portion on top. The channel region portions will form channel regions of the horizontal channel transistors of the logic cells.

FIG. 6 only shows trenches 210 with a longitudinal direction in the Y direction (the second horizontal direction). It should however be noted that also trenches with a longitudinal direction in the X direction (the first horizontal direction) may be formed through the layer stack 200.

The patterning of the layer stack 200 may further comprise forming of an initial set of trenches through the layer stacks prior to forming the cuts/trenches 210 (which accordingly may be referred to as a second set of trenches 210). The initial set of trenches may like the (second) trenches 210 be formed using a high-aspect-ratio etch. The initial set of trenches may be etched using an initial etch mask defining an initial trench pattern (e.g. a resist-based mask with a lithographically defined initial trench pattern). The initial etch mask may be removed after the initial set of trenches have been formed. The active layer may need to be divided/cut also in regions other than those of the trenches 210. Forming an initial set of trenches allows this and may accordingly serve as an initial active layer patterning. The initial set of trenches may accordingly separate the layer stack 210 into a preliminary set of sub-stacks, which then may be further partitioned into the aforementioned set of sub-stacks by the forming of the trenches 210. The initial set of trenches may be filled with a sacrificial fill material (e.g. an organic spin-on-layer such as spin-on-carbon) prior to forming the hard mask 208. The sacrificial fill material may be removed during the etching of the trenches 210.

Figure 6B:
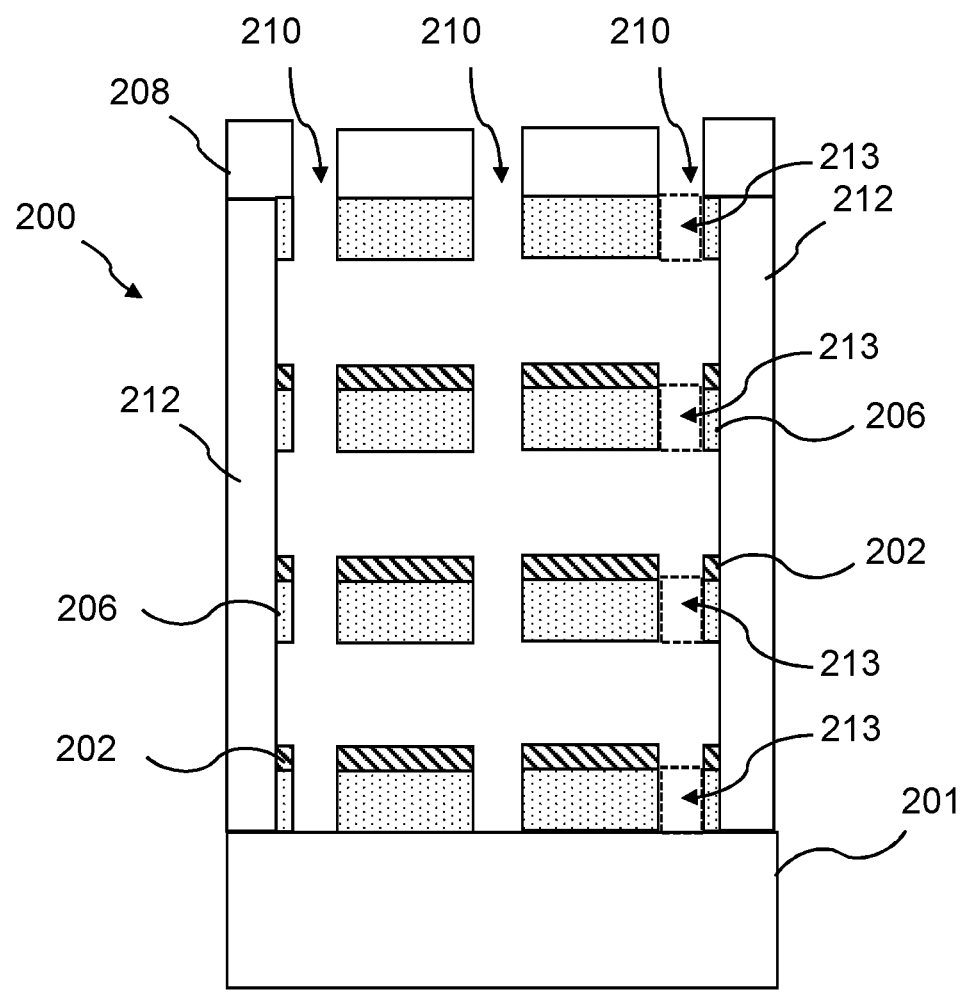

By using a selective isotropic etch process (wet or dry), the dummy-gate material may then be removed from each island, as shown in FIG. 6b. As dummy-gate material removal may involve removing a considerable amount of material from the stack, a mechanical support may be provided for remaining portions of the active layer and inter-layer dielectric. This may be achieved by the design rule that every gate-island/sub-stack is touching/abutting a vertical support wall of an insulating material, such as silicon oxide. A "tall" support wall may be formed by etching a wall trench through the full thickness of the layer stack and filling the wall trench with oxide material to form the tall support wall, denoted 212 in FIG. 6a. Tall support walls 212 may e.g. be formed prior to forming the cuts 210 in the layer stack In addition to tall support walls 212, a number of "short" support walls may also be formed. A short support wall may bridge the gap between inter-layer dielectric portions of a sub-stack not abutting a tall support wall 212 and inter-layer dielectric portions of a sub-stack abutting a tall support wall 212. Short support walls may e.g. be formed after forming the trenches 210 and prior to removing the sacrificial layer portions 204 from the sub-stacks.

Short support walls may more specifically be formed by selectively depositing a dielectric (e.g. silicon oxide) on sidewalls of the inter-layer dielectric portions such that a gap between inter-layer dielectric portions of neighboring sub-stacks is closed/bridged by the deposited dielectric. Thereby, inter-layer dielectric portions of a sub-stack may be physically joined with inter-layer dielectric portions of a neighboring sub-stack abutting a tall support wall. The dielectric may be deposited on sidewalls of the inter-layer dielectric portions facing any one of the (second) trenches 210 as well as sidewalls of the inter-layer dielectric portions facing any one of the initial set of trenches. Dielectric deposited in the trenches 210 may be removed, e.g. by etching through the trench pattern in the hard mask 208, such that short support walls 210 remain only in the initial set of trenches. By way of example, the dashed box 213 indicate selectively deposited dielectric material prior to being removed by etching.

Figure 6C:
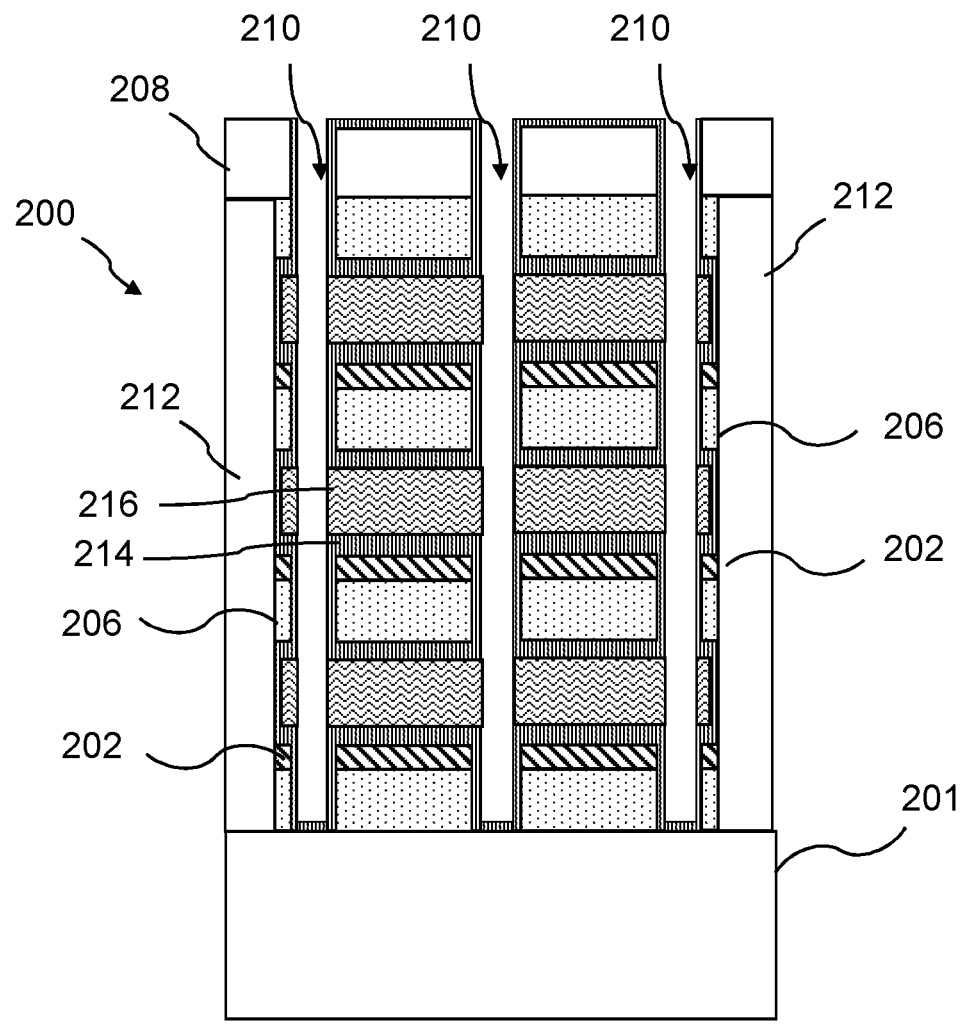
Figure 6D:
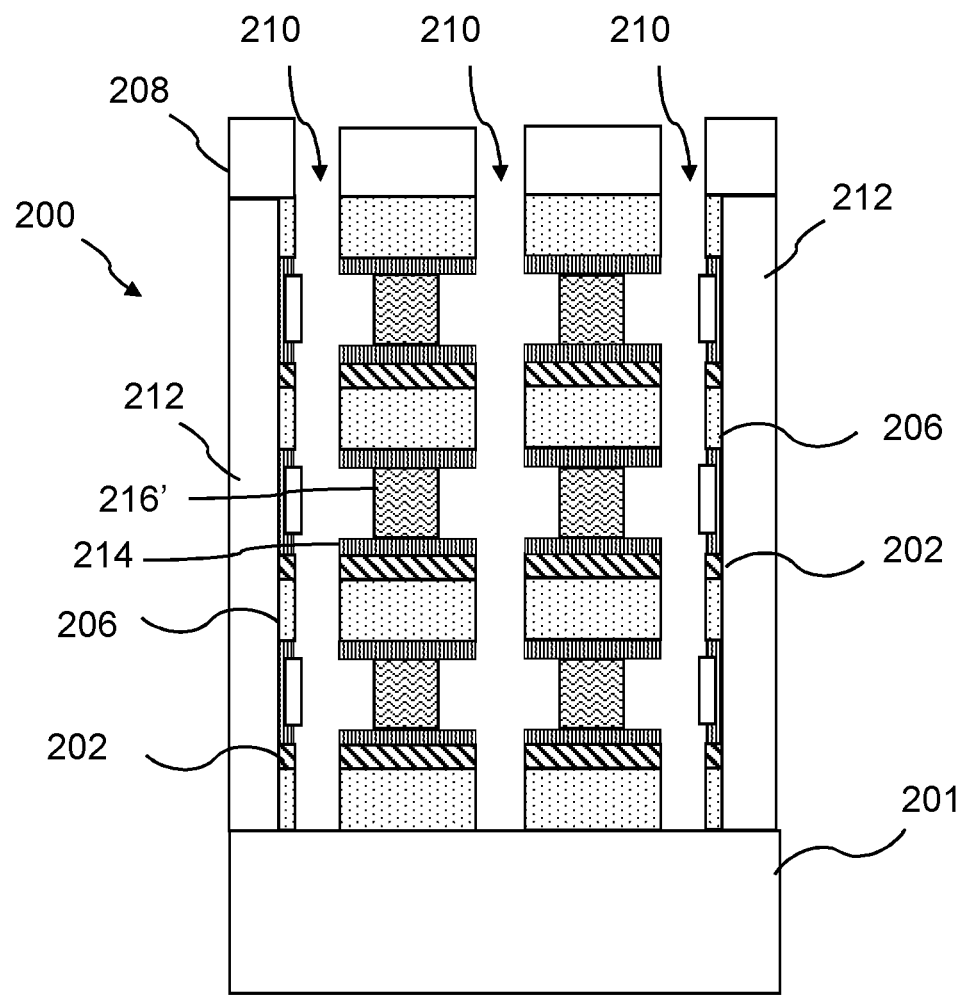

After removing the sacrificial layer portions 204, a gate-dielectric 214 (e.g. of a high-k dielectric) and then a gate electrode material (e.g. one or more gate metals such as work function metal and fill metal) may then be deposited in the form of gate lines 216 in the space/cavity formed by removing the dummy-gate (FIG. 6c). The gate lines 216 may thus extend across the channel region portions 202. Conformal deposition processes may be used for the deposition of the gate-dielectric 214 and the gate electrode material(s) 216. The trenches 210 may subsequently be re-etched (e.g. using the hard mask 208 as an etch mask) to remove gate electrode material deposited in the trenches 210.

Figure 6E:
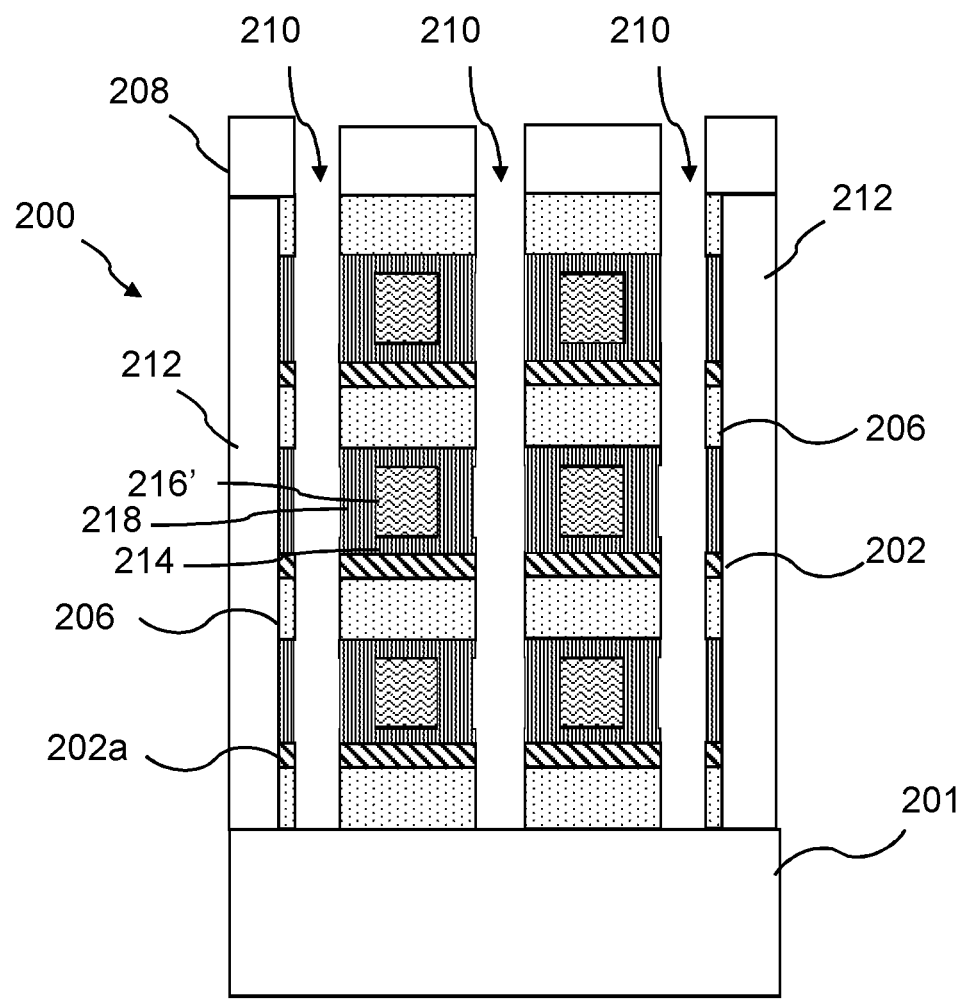

The process may then proceed with forming of spacers 218 (i.e. insulating sidewall spacers) for the gate (lines). Spacer formation may proceed by first recessing the (metal) gate lines 216 from the sides (FIG. 6d) by an isotropic (metal) etch to form recessed gate lines 216' and fill the thus formed cavity with the spacer material (FIG. 6e). In FIG. 6e the spacers 218 are indicated with a same pattern as the gate oxide 214. The spacer material may however be formed of a different material, for example SiCO, SiCN or SiN. The excess material in the trenches 210 may then be removed by an anisotropic etch (e.g. a high-aspect-ratio etch), e.g. using the patterned hard mask as an etch mask, thereby arriving at the structure shown in FIG. 6e.

The process may then proceed with forming source/drain regions 220 on ends of the channel region portions 202 facing the trenches 210. A suitable epitaxial process may be used. The source/drain regions may be doped, suitably using in-situ doping during the epitaxy. P-type and N-type source/drain regions may be formed sequentially, by masking P-type device regions while forming the N-type source/drain regions and masking the N-type device regions while forming the P-type source/drain regions.

The process may then proceed with forming the wiring lines and vertical pillars, i.e. vias. For the vias, vertical holes may be etched through the layer stack at positions where vias are needed within the logic cell layout. The holes may be filled with metal to form the vias. Horizontally extending cavities ("wiring cavities") may be formed by merging inter-layer dielectric portions of neighboring sub-stacks through selective deposition of a dielectric on sidewalls of the inter-layer dielectric portions 206 (i.e. similar to the above process for forming the short support walls). Inter-layer dielectric portions which where removed during the forming of the trenches 210 may thus be "restored" to form inter-device tier isolation for the wiring lines which are to be formed.

Wiring lines may then be formed by forming vertical holes through the layer stack, in communication with the wiring cavities, to serve as filling ports for the metal material forming the wiring lines. The wiring lines may be filled over the whole length of the line through these filling ports. The filling may advantageously employ a conformal deposition, such as atomic layer deposition (ALD). This may reduce a risk of pinch-off before the filling is complete. The metal in the fill ports may subsequently be removed and refilled with a dielectric, to cut the metal lines at this location.

Figure 6F:
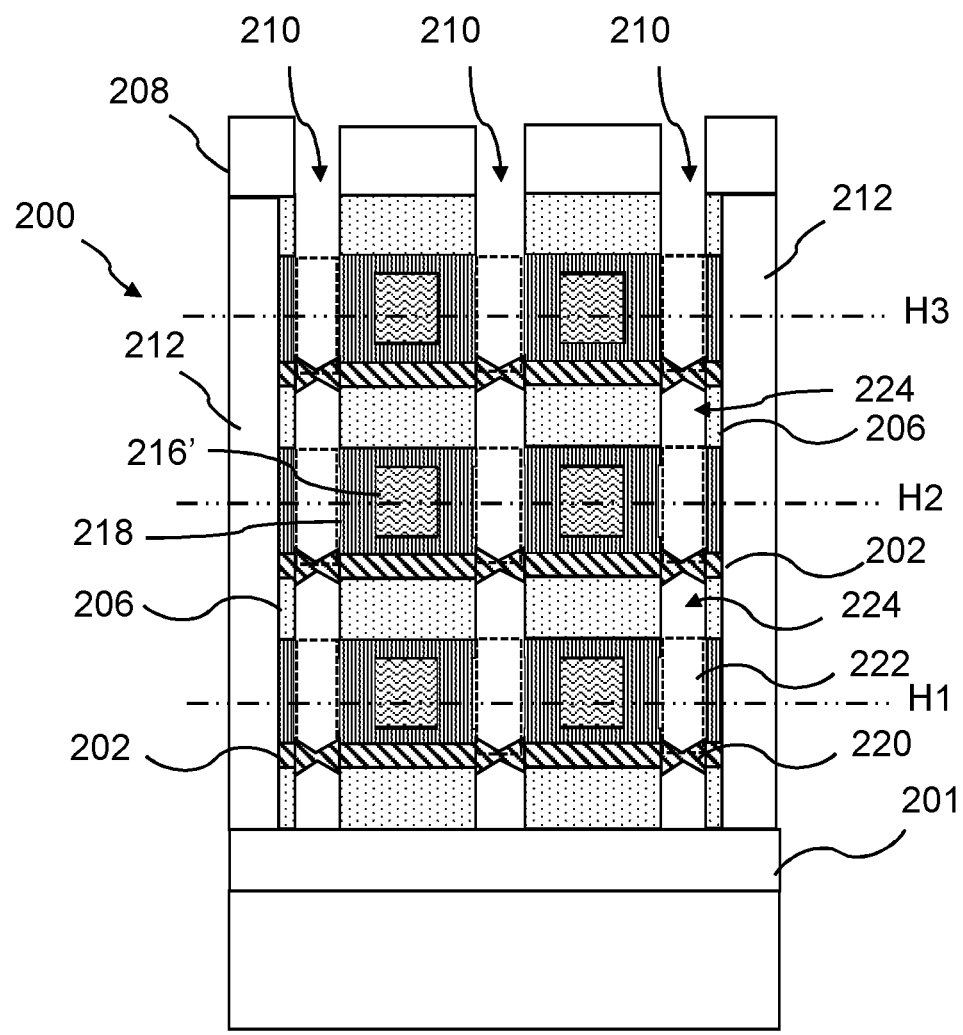

FIG. 6f shows the resulting structure with wiring lines 222 indicated with dashed outlines. Gate lines 216' extend across and over the channel region portions 202 of the horizontal channel transistors. The wiring lines 222 extend across and over source/drain regions of the active semiconductor pattern such the wiring lines abut the source/drain regions 220 at the crossings. Reference sign 224 indicate example regions in which the inter-layer dielectric may be restored to provide inter-tier isolation, as discussed above. The gate lines 216' and wiring lines 222 are arranged side-by-side. Gate line-wiring line separation is ensured by the spacers 218. The single layer of gate lines and wiring lines 216', 222 of each logic cell of each device tier is readily visible in the figure, also indicating a representation of respective common geometric horizontal planes H1-H3 intersected by all gate lines and wiring lines 216', 222 of the respective logic cell.

Input and/or output staircase structures, e.g. 120 and 130 discussed above, may be fabricated adjacent the stack of logic cell 110. The steps do the respective staircase structures 120, 130 may be formed sequentially, beginning with the bottom-most step. The fabrication of a step of a device tier may comprise forming a dielectric layer embedding horizontal (metal) output or input lines connecting to the logic cell 110 (e.g. to the primary input logic gates or primary output logic gate) of the same device tier 110. A damascene-type process may be used, comprising etching trenches in the dielectric layer and filling the trenches with metal to form the lines. Fabrication of the next step above may then follow by forming horizontal (metal) output or input lines with line ends located horizontal inside the line ends of the previous step, such that a staircase structure is obtained. However, this outline merely represents one example and other fabrication processes for staircase structures are as such known from VNAND technology (in which staircase structures may be used to provide individual control signals to transistor gates of the VNAND) and may be employed for forming the staircase structures of the 3D IC 100.

Additional circuitry of the 3D IC, such as the control plane 140, may be fabricated sequentially with the stack of logic cells 110. For example, active devices of the control plane 140 may be formed on the supporting substrate 101 using conventional front-end-of-line techniques, prior to forming the stack of logic cells 110. The active devices may subsequently be connected to the stack of logic cells 110 via higher-level control circuitry of the control plane 140, e.g. formed in a damascene-type process after fabricating the stack of logic cells 110.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A 3D integrated circuit (8D IC), comprising:
a plurality of logic cells stacked on top of each other, each logic cell forming part of one of a plurality of vertically stacked device tiers of the 3D IC, and each logic cell comprising a network of logic gates, each logic gate comprising a network of transistors, each transistor having a horizontal channel,
wherein a layout of the network of logic gates of each logic cell is identical among said logic cells such that each logic gate of any one of said logic cells has a corresponding logic gate in each other one of said logic cells, and
wherein each logic cell comprises:
a single active layer forming an active semiconductor pattern of the transistors of the logic gates of the logic cell, and
a single layer of horizontally extending conductive lines comprising gate lines defining transistor gates of the transistors, and wiring lines forming interconnections in the network of transistors and in the network of logic gates of said logic cell.

2. The 3D IC of claim 1, wherein the network of logic gates of each logic cell comprises a set of primary input logic gates configured to receive a set of primary input signals to the logic cell, and a primary output logic gate configured to output a primary output signal from the logic cell.

3. The 3D IC of claim 2, wherein the primary input logic gates and the primary output logic gate of each respective logic cell are located at a periphery of the respective logic cell.

4. The 3D IC of claim 1, further comprising a set of vertical power rails common for the logic cells of the device tiers, each power rail formed by a via extending vertically through the stack of logic cells.

5. The 3D IC of claim 3, further comprising:
an input staircase structure arranged at a side of the stack of logic cells and comprising an input tier for each one of the plurality of device tiers, each input tier comprising a set of horizontally extending input wires connected to the set of primary input logic gates of the logic cell of the respective device tier; and
a respective set of vertical input contacts for each input tier of the input staircase structure, each input contact connected to a respective input wire of the respective input tier.

6. The 3D IC of claim 5, wherein each vertical input contact is formed by a via, the vias extending from a common control plane to an input wire of a respective one of the device tiers, wherein the common control plane is arranged in a control tier located above a top-most logic cell of the stack of logic cells.

7. The 3D IC of claim 5, further comprising:
an output staircase structure arranged at a side of the stack of logic cells and comprising an output tier for each one of the plurality of device tiers, each output tier comprising a horizontally extending output wire connected to the primary output logic gate of the logic cell of the respective device tier; and
a vertical output contact for each output tier of the output staircase structure, each output contact connected to an output wire of the respective output tier.

8. The 3D IC of claim 7, wherein each vertical output contact is formed by a via, the vias extending from a common control plane to an output wire of a respective one of the device tiers, wherein the common control plane is arranged in a control tier located above a top-most logic cell of the stack of logic cells.

9. The 3D IC of claim 1, wherein each one of the logic cells forms a 1-bit module of an N-bit arithmetic and logic core or multiplier array.

10. The 3D IC of claim 1, wherein each logic gate is a logic gate of a respective type selected from the group comprising: NOT, AND, OR, NAND, NOR, EXOR, MUX.

* * * * *